(12) United States Patent
Chandrachood et al.

(10) Patent No.: US 8,293,430 B2
(45) Date of Patent: Oct. 23, 2012

(54) METHOD FOR ETCHING A MOLYBDENUM LAYER SUITABLE FOR PHOTOMASK FABRICATION

(75) Inventors: Madhavi Chandrachood, Sunnyvale, CA (US); Ajay Kumar, Cupertino, CA (US); Wai-Fan Yau, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1477 days.

(21) Appl. No.: 11/044,358

(22) Filed: Jan. 27, 2005

(65) Prior Publication Data

US 2006/0166108 A1 Jul. 27, 2006

(51) Int. Cl.
*G03F 1/00* (2012.01)
(52) U.S. Cl. .......................................................... 430/5
(58) Field of Classification Search .............. 430/5, 311, 430/313, 323
See application file for complete search history.

(56) References Cited

U.S. PATENT DOCUMENTS

| | | |
|---|---|---|
| 4,263,088 A | 4/1981 | Gorin |
| 4,310,380 A | 1/1982 | Flamm et al. |
| 4,357,195 A | 11/1982 | Gorin |
| 4,478,678 A | 10/1984 | Watanabe |
| 4,484,978 A | 11/1984 | Keyser |
| 4,504,574 A * | 3/1985 | Meyer et al. .................. 430/331 |
| 4,579,623 A | 4/1986 | Suzuki et al. |
| 4,581,101 A | 4/1986 | Senoue et al. |
| 4,666,555 A | 5/1987 | Tsang |
| 4,713,141 A | 12/1987 | Tsang |
| 4,726,879 A | 2/1988 | Bondur et al. |
| 4,741,799 A | 5/1988 | Chen et al. |
| 4,784,720 A | 11/1988 | Douglas |
| 4,790,903 A | 12/1988 | Sugano et al. |
| 4,855,017 A | 8/1989 | Douglas |
| 4,863,549 A | 9/1989 | Grunwald |
| 4,889,588 A | 12/1989 | Fior |
| 4,891,118 A | 1/1990 | Ooiwa et al. |
| 4,992,136 A | 2/1991 | Tachi et al. |
| 5,087,857 A | 2/1992 | Ahn |
| 5,110,408 A | 5/1992 | Fujii et al. |
| 5,160,408 A | 11/1992 | Long |

(Continued)

FOREIGN PATENT DOCUMENTS

DE 36 13 181 10/1987

(Continued)

OTHER PUBLICATIONS

Tsujimoto, et al., A New Side Wall Protection Technique in Microwave Plasma Etching Using a Chopping Method, 18th (1986 International) Conference of Solid State Devices and Materials, Tokyo, 1986, pp. 229-232.

(Continued)

*Primary Examiner* — Cynthia H. Kelly
*Assistant Examiner* — Brittany Raymond
(74) *Attorney, Agent, or Firm* — Patterson & Sheridan, LLP

(57) ABSTRACT

Methods for fabricating a photomask are disclosed herein. In one embodiment, a method for fabricating a photomask includes providing a filmstack having a molybdenum layer and a light-shielding layer in a processing chamber, patterning a first resist layer on the light-shielding layer, etching the light-shielding layer using the first resist layer as an etch mask, and etching the molybdenum layer using the patterned light-shielding layer and the patterned first resist layer as a composite mask.

1 Claim, 6 Drawing Sheets

U.S. PATENT DOCUMENTS

| | | |
|---|---|---|
| 5,164,330 A | 11/1992 | Davis et al. |
| 5,242,538 A | 9/1993 | Hamrah et al. |
| 5,302,241 A | 4/1994 | Cathey, Jr. |
| 5,316,616 A | 5/1994 | Nakamura et al. |
| 5,352,324 A | 10/1994 | Gotoh et al. |
| 5,358,601 A | 10/1994 | Cathey |
| 5,362,358 A | 11/1994 | Yamagata et al. |
| 5,429,070 A | 7/1995 | Campbell et al. |
| 5,433,823 A | 7/1995 | Cain |
| 5,458,734 A | 10/1995 | Tsukamoto |
| 5,468,341 A | 11/1995 | Samukawa |
| 5,474,864 A | 12/1995 | Isao et al. |
| 5,482,799 A | 1/1996 | Isao et al. |
| 5,486,706 A | 1/1996 | Yuki et al. |
| 5,571,366 A | 11/1996 | Ishii et al. |
| 5,605,776 A | 2/1997 | Isao et al. |
| 5,614,060 A | 3/1997 | Hanawa |
| 5,629,114 A | 5/1997 | Isao et al. |
| 5,643,473 A | 7/1997 | Tachi et al. |
| 5,658,472 A | 8/1997 | Bartha et al. |
| 5,674,647 A | 10/1997 | Isao et al. |
| 5,683,538 A | 11/1997 | O'Neill et al. |
| 5,691,090 A | 11/1997 | Isao et al. |
| 5,705,025 A | 1/1998 | Dietrich et al. |
| 5,705,081 A | 1/1998 | Inazawa et al. |
| 5,759,921 A | 6/1998 | Rostoker |
| 5,767,021 A | 6/1998 | Imai et al. |
| 5,830,607 A | 11/1998 | Isao et al. |
| 5,843,847 A | 12/1998 | Pu et al. |
| 5,854,136 A | 12/1998 | Huang et al. |
| 5,866,483 A | 2/1999 | Shiau et al. |
| 5,880,033 A | 3/1999 | Tsai |
| 5,899,749 A | 5/1999 | Becker et al. |
| 5,900,163 A | 5/1999 | Yi et al. |
| 5,933,729 A | 8/1999 | Chan |
| 5,938,897 A | 8/1999 | Isao et al. |
| 5,952,128 A | 9/1999 | Isao et al. |
| 5,965,463 A | 10/1999 | Cui et al. |
| 5,994,160 A | 11/1999 | Niedermann et al. |
| 5,994,235 A | 11/1999 | O'Donnell |
| 6,022,460 A | 2/2000 | O et al. |
| 6,025,271 A | 2/2000 | Howard et al. |
| 6,037,265 A | 3/2000 | Mui et al. |
| 6,080,529 A | 6/2000 | Ye et al. |
| 6,087,047 A | 7/2000 | Mitsui et al. |
| 6,193,855 B1 | 2/2001 | Gopalraja et al. |
| 6,221,784 B1 | 4/2001 | Schmidt et al. |
| 6,228,541 B1 | 5/2001 | Isao et al. |
| 6,277,763 B1 | 8/2001 | Kugimiya et al. |
| 6,284,148 B1 | 9/2001 | Laermer et al. |
| 6,312,616 B1 | 11/2001 | Chinn et al. |
| 6,326,107 B1 | 12/2001 | Watanabe |
| 6,391,790 B1 | 5/2002 | Stoehr et al. |
| 6,391,791 B1 | 5/2002 | Sasaki et al. |
| 6,403,267 B1 | 6/2002 | Tzu et al. |
| 6,472,107 B1 | 10/2002 | Chan |
| 6,569,577 B1 | 5/2003 | Isao et al. |
| 6,583,065 B1 | 6/2003 | Williams et al. |
| 6,689,515 B2 | 2/2004 | Yoshioka et al. |
| 6,716,758 B1 | 4/2004 | Donohoe |
| 6,872,322 B1 | 3/2005 | Chow et al. |
| 7,361,433 B2 | 4/2008 | Hwang et al. |
| 2002/0012851 A1 | 1/2002 | Coronel et al. |
| 2002/0039689 A1 | 4/2002 | Yusa et al. |
| 2002/0177050 A1* | 11/2002 | Tanaka ................. 430/5 |
| 2002/0177321 A1 | 11/2002 | Li et al. |
| 2002/0177322 A1 | 11/2002 | Li et al. |
| 2003/0049934 A1 | 3/2003 | Buie et al. |
| 2003/0059720 A1 | 3/2003 | Hwang et al. |
| 2003/0087531 A1 | 5/2003 | Kang et al. |
| 2003/0089680 A1 | 5/2003 | Johnson et al. |
| 2003/0129539 A1 | 7/2003 | Tsai et al. |
| 2003/0173333 A1* | 9/2003 | Wang et al. .............. 216/67 |
| 2003/0180631 A1* | 9/2003 | Shiota et al. ............. 430/5 |
| 2003/0186137 A1 | 10/2003 | Chan |
| 2003/0201455 A1 | 10/2003 | Takahashi et al. |
| 2004/0072081 A1 | 4/2004 | Coleman et al. |
| 2004/0086787 A1 | 5/2004 | Waheed et al. |
| 2004/0097077 A1 | 5/2004 | Nallan et al. |
| 2004/0242021 A1 | 12/2004 | Kraus et al. |
| 2005/0175937 A1* | 8/2005 | Bae .......................... 430/312 |

FOREIGN PATENT DOCUMENTS

| | | |
|---|---|---|
| DE | 37 06 127 | 10/1987 |
| DE | 39 40 083 A1 | 6/1991 |
| DE | 42 02 447 | 7/1992 |
| DE | 42 04 848 | 8/1992 |
| DE | 101 00 822 A1 | 7/2002 |
| EP | 0 054 736 | 6/1982 |
| EP | 0 200 951 A2 | 12/1986 |
| EP | 0 363 982 A2 | 4/1990 |
| EP | 0 383 570 A2 | 8/1990 |
| EP | 0 363 982 | 10/1990 |
| EP | 0 489 407 | 6/1992 |
| EP | 0 497 023 A1 | 8/1992 |
| EP | 0 552 491 | 7/1993 |
| EP | 0 704 886 | 4/1996 |
| EP | 0 710 977 A1 | 5/1996 |
| EP | 0 734 046 A2 | 9/1996 |
| EP | 0 807 968 | 11/1997 |
| EP | 1 420 438 A2 | 5/2004 |
| JP | 59-47733 | 3/1984 |
| JP | 60-50923 | 3/1985 |
| JP | 60-62125 | 4/1985 |
| JP | 60-219748 | 11/1985 |
| JP | 61-1023 | 1/1986 |
| JP | 61-263125 | 11/1986 |
| JP | 62-181433 | 8/1987 |
| JP | 63-013334 | 1/1988 |
| JP | 63-115338 | 5/1988 |
| JP | 2-14523 | 1/1990 |
| JP | 2-156529 | 6/1990 |
| JP | 2-312229 | 12/1990 |
| JP | 03-129820 | 6/1991 |
| JP | 6-181185 | 6/1994 |
| JP | 6-342769 | 12/1994 |
| JP | 7-142453 | 6/1995 |
| JP | 09-082686 | 3/1997 |
| JP | 10-004084 A | 1/1998 |
| JP | 10079372 | 3/1998 |
| JP | 2002351046 A | 12/2002 |
| JP | 2004038154 A | 2/2004 |
| WO | WO 88/09830 A1 | 12/1988 |
| WO | WO 01/09934 | 2/2001 |
| WO | WO 01/96955 | 12/2001 |
| WO | WO-01/96955 A2 | 12/2001 |
| WO | WO-2004/034445 A2 | 4/2004 |

OTHER PUBLICATIONS

Mahi, et al., The Etching of Silicon in Diluted SF6 Plasmas: Correlation between the Flux of Incident Species and the Etching Kinetics, Journal of Vacuum Science and Technology B, May 1987, pp. 657-666, vol. 5, No. 3.

Maruyama et al., Reduction of Charge Build-Up with Pulse-Modulated Bias in Pulsed Electron Cyclotron Resonance Plasma, Jpn. J. Appl. Phys., 1998, 2306-2310, vol. 37.

Kawakami, et al., Time Modulated Etching for High-Aspect Ratio Patterning, 35th Applied Physics Related Joint Lecture, Mar. 28, 1988, pp. 28-G-5.

Okudaira, et al., Micromachining by Plasma, EP-89, 1989, p. 9-18.

Rangelow, I., High Resolution Tri-Level Process by Downstream-Microwave RF-Biased Etching, SPIE, 1990, vol. 1392, Advanced Techniques for Integrated Circuit Processing.

Tin, et al., Effects of RF Bias on Remote Microwave Plasma Assisted Etching of Silicon in SF6, J. Electrochem. Soc., Oct. 1991, vol. 138, No. 10, pp. 3094-3100.

Paul, et al., Fabrication of High Aspect Ratio Structures using Chlorine Gas Chopping Technique, Microelectronic Engineering, 1997, pp. 79-82, vol. 35.

Ogata, et al., A New Microwave Plasma Etching System Using Time Modulation Bias Technology, Hitachi Review, 1999, pp. 344-348, vol. 48, No. 6.

Schaepkens, et al., J. Vac. Sci. Technol. B, Mar./Apr. 2000, pp. 856-863, vol. 18, No. 2.

Abstract from Korean Patent KR 2002002687A, Jan. 10, 2002, Hynix Semiconductor Inc.

Wu et al., MoSi Etch of Phase-Shift Masks, Journal of Microlithography, Microfabrication, and Microsystems, Jan. 2003, pp. 54-60, vol. 2, Issue 1.

Abstract from Korean Patent KR 2003002844A, Jan. 9, 2003, Hynix Semiconductor Inc.

Seo, et al., The Feasibility Study of Thin Cr Film for Low Process Bias, Photomask Japan 2003 Conference 5130, Apr. 16, 2003, Proceedings of SPIE, vol. 5130.

Wu, An Investigation of Cr Etch Kinetics, 23$^{rd}$ Annual BACUS Symposium on Photomask Technology. Edited by Kimmel, Kurt R.; Staud, Wolfgang. Proceedings of the SPIE, Dec. 2003, pp. 701-712, vol. 5256.

Kim et al., Decrease of Chrome Residue on MoSiON in Embeded Attenuated-PSM Processing, Apr. 2004, Photomask Japan 2004 Conference, Proceedings of SPIE, 2004, vol. 5446.

Wu, Photomask Cr-MoSi Etching, Journal of Vacuum Science & Technology B: Microelectronics and Nanometer Structures, May 2004, pp. 1150-1159, vol. 22, Issue 3.

Philipsen, et al., Printability of Topography in Alternating Aperture Phase-Shift Masks, Proceedings of SPIE, Oct. 2004, pp. 587-595, vol. 5567.

European Search Report for EP 06 25 0435, dated May 8, 2008; consists of 8 pages.

Aoyama, et al. "Advanced Cr Dry Etching Process" SPIE Symposium on Photomask and X-Ray Technology VI, Yokohama, Japan, Sep. 1999 SPIE, vol. 3748 pp. 137-146.

Fujisawa, et al. "Evaluation of NLD Mask Dry Etching System" SPIE Symposium on Photomask and X-Ray Technology VI, Yokohama, Japan, Sep. 1999 vol. 3748 pp. 147-152.

Kwon, et al., "Loading Effect Parameters at Dry Etcher System and Their Analysis at Mask-to-Mask Loading and Within-Mask Loading" Proceedings of SPIE, vol. 4562 (2002) pp. 79-87.

Miyashita, et al., "Manufacturing of Half-Tone Phase Shift Masks: II. Writing and Process", Proceedings of the SPIE—The International Society for Optical Engineering USA, vol. 2254, 1994, pp. 248-260.

Mohri, et al., "Manufacturing of Half-Tone Phase Shift Masks: I. Blank" Proceedings of the SPIE—The International Society for Optical Engineering USA, vol. 2254, 1994, pp. 238-247.

PCT International Search Report dated Feb. 14, 2005 for PCT/US2004/008335.

PCT Search Report for PCT/US03/11549, dated Feb. 19, 2004.

Ruhl, et al. "Chrome Dry Etch Process Characterization Using Surface Nano Profiling" Proceedings of SPIE, vol. 4186 (2001) pp. 97-107.

European Patent Office Search Report dated Mar. 11, 2009 for Application No. 06250436.0.

European Patent Office Search Report dated Mar. 12, 2009 for Application No. 06250435.2.

C. Y. Chang & S. M. Sze, "ULSI Technology" published 1996, p. 339.

Taiwan Official Letter of Pending Patent Application Under Examination dated Apr. 23, 2009.

Official Letter dated May 8, 2009, from Chinese Patent Office for corresponding Chinese Patent application No. 2006100663560.

Notice of Reasons for Rejection, Japanese Patent Application No. P2006-016871 dated Nov. 4, 2009.

Office Action for Taiwan Patent Application No. 95102511 dated Nov. 30, 2009.

Summary of Office Action for Taiwan Patent Application 95102511 dated Dec. 18, 2009.

Official Letter dated Oct. 13, 2009, from European Patent Office for corresponding Application No. 06250435.2.

Notice of Final Rejection dated Dec. 14, 2010 (With English Translation) for Japanese Patent Application No. 2006-016871.

* cited by examiner

METHOD FOR ETCHING A MOLYBDENUM LAYER SUITABLE FOR PHOTOMASK FABRICATION

BACKGROUND OF THE INVENTION

1. Field of the Invention

Embodiments of the present invention generally relate to a method for plasma etching a molybdenum layer and, more specifically, to a method for etching a molybdenum layer during photomask fabrication.

2. Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 30 masks is used to construct a chip and can be used repeatedly.

A mask is typically a glass or a quartz substrate that has a layer of chromium on one side. The chromium layer is covered with an anti-reflective coating and a photosensitive resist. During a patterning process, the circuit design is written onto the mask by exposing portions of the resist to ultraviolet light, making the exposed portions soluble in a developing solution. The soluble portion of the resist is then removed to create a patterned. This pattern allows the exposed underlying chromium to be etched. The etch process removes the chromium and anti-reflective layers from the mask at locations where the resist was removed, i.e., the exposed chromium is removed.

Another mask utilized for patterning is known as a phase shift mask. The phase shift mask is similar to the mask described above, except that alternating adjacent areas of quartz regions exposed through the patterned chromium layer are covered with a layer of light-attenuating material. The thickness of the light-attenuating material is about equal to half the wavelength of light which will be utilized to transfer the circuit patterns to a substrate during fabrication. In one embodiment, the layer of light-attenuating material is about 50 nm and about 100 nm thick. It is contemplated that different thicknesses may be utilized. The attenuating material layer may be deposited by conventional methods known in the art, such as by chemical vapor deposition (CVD) techniques. Examples of suitable light-attenuating material include molybdenum silicide, molybdenum silicon (MoSi), molybdenum silicon oxynitride ($MoSi_xN_yO_z$), combinations thereof, or any other material suitable for shifting the phase of light passing therethrough.

As the light is shown through the phase shift mask to expose resist disposed on the substrate during circuit fabrication, the light impinging in the resist through one opening in the mask is 180 degrees out of phase relative to the light passing through the light-attenuating material covering the immediately adjacent opening. As a result, light that may be scattered at the edges of the mask opening is cancelled out by the 180 degree light out of phase scattering at the edge of the adjacent opening, causing a tighter distribution of light in a predefined region of the resist. The tighter distribution of light advantageously facilitates writing of features having smaller critical dimensions.

In one etch process, known as dry etching, reactive ion etching, or plasma etching, a plasma is used to enhance a chemical reaction and pattern chromium layer of the mask through a polymer resist. After the polymer resist is stripped, the patterned chromium layer is utilized as a mask to etch the light-attenuating material. Undesirably, conventional processes used to etch the light-attenuating material (e.g., molybdenum) often exhibit etch bias due to attack on sidewalls of the openings in the chromium layer utilized to pattern the light-attenuating material. As the openings are enlarged during the chromium etch process, the critical dimension of patterned chromium layer is not accurately transferred to the light-attenuating material. Thus, conventional molybdenum etch processes may not produce acceptable results for masks having critical dimensions less than about 5 μm. This results in non-uniformity of the etched features of the mask and correspondingly diminishes the ability to produce features for devices having small critical dimensions using the mask.

As the critical dimensions of mask continue to shrink, the importance of etch uniformity increases. Thus, the ability to accurately maintain critical dimensions during fabrication of a photomask is highly desirable.

Thus, there is a need for an improved molybdenum etch process suitable for photomask fabrication.

SUMMARY OF THE INVENTION

The present invention generally provides a method for fabricating a photomask. In one embodiment, a method for fabricating a photomask includes providing a filmstack having a molybdenum layer, a light-shielding layer and a patterned first resist layer in a processing chamber, etching the light-shielding layer using the first resist layer as an etch mask, and etching the molybdenum layer using the patterned light-shielding layer and the patterned first resist layer as a composite mask.

In another embodiment, a method for fabricating a photomask includes etching a chromium layer using a first photoresist layer as an etch mask, etching a molybdenum layer to expose underlying quartz material through an opening defined through the first photoresist layer and chromium layer, removing the first photoresist layer in-situ a processing chamber in which at least one of the molybdenum layer or chromium layer is etched, patterning second photoresist layer on the chromium layer, and etching the chromium layer using the second photoresist layer as an etch mask to expose the molybdenum layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
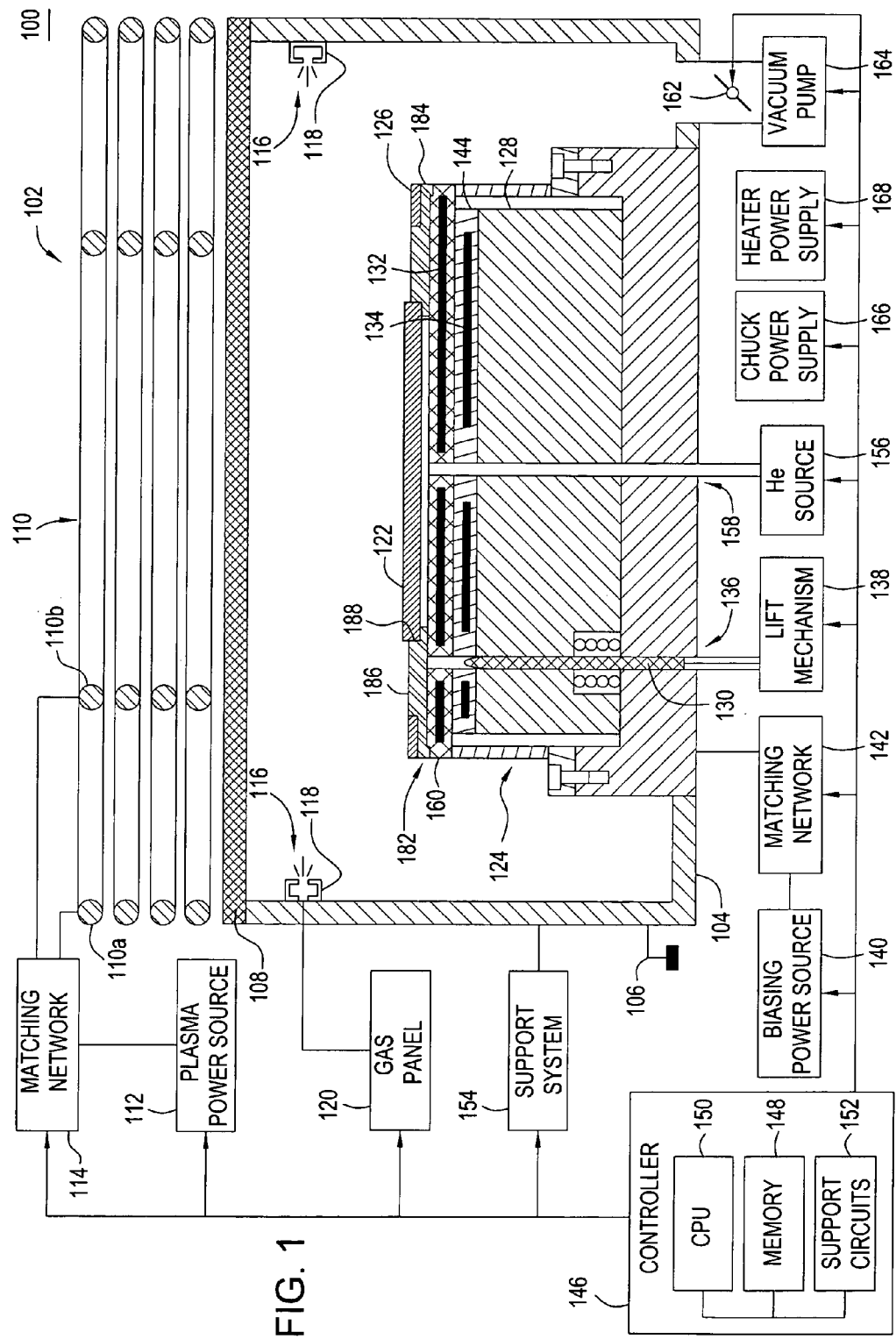
FIG. 1 is a schematic sectional view of one embodiment of a processing chamber suitable for etching a molybdenum layer.

To facilitate understanding, identical reference numerals have been used, where possible, to designate identical elements that are common to the figures. It is also contemplated that features of one embodiment may be beneficially incorporated in other embodiments, including those not explicitly described herein.

DETAILED DESCRIPTION

FIG. 1 depicts a schematic diagram of one embodiment of a processing chamber 100 suitable for etching molybdenum. Suitable processing chambers that may be adapted for use with the teachings disclosed herein include, for example, the Decoupled Plasma Source (DPS®) II processing chamber, or the Tetra I and Tetra II Photomask etch systems, all of which are available from Applied Materials, Inc. of Santa Clara, Calif. The particular embodiment of the processing chamber 100 shown herein is provided for illustrative purposes and should not be used to limit the scope of the invention.

Figure 1A:
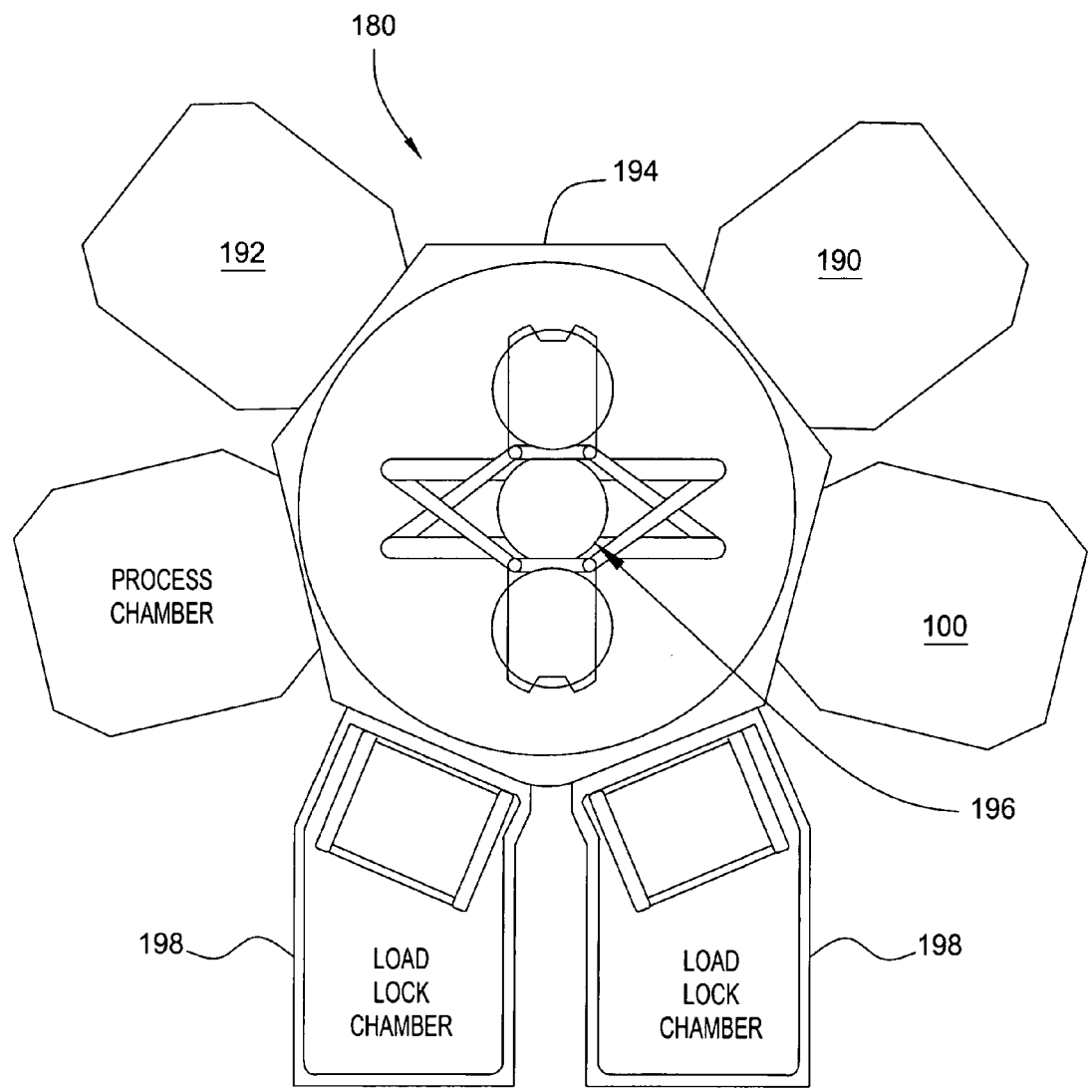
FIG. 1A is a plan sectional view of one embodiment of a processing system including the processing chamber of FIG. 1.

The processing chamber 100 may be part of a processing system 180 as illustrated in FIG. 1A. The processing system 180, such as, for example, a Centura® integrated semiconductor wafer processing system, also available from Applied Materials, Inc., may include a first processing chamber 192 suitable for ashing and a second chamber 194 suitable for polymer deposition. Examples of suitable ashing and deposition chambers include AXIOM HT™ and Tetra II processing chambers, also available from Applied Materials, Inc. The processing chamber 100, processing chambers 190, 192 and load lock chambers 198 are coupled to a central transfer chamber 194 having a robot 196 disposed inside. The robot 196 facilitates transfer of substrates between the processing chamber 100, processing chambers 190, 192 and the load lock chambers 198.

Returning to FIG. 1, the processing chamber 100 generally comprises a process chamber 102 having a substrate pedestal 124 within a conductive body (wall) 104, and a controller 146. The chamber 102 has a substantially flat dielectric ceiling 108. Other modifications of the chamber 102 may have other types of ceilings, e.g., a dome-shaped ceiling. An antenna 110 is disposed above the ceiling 108. The antenna 110 comprises one or more inductive coil elements that may be selectively controlled (two co-axial elements 110a and 110b are shown in FIG. 1). The antenna 110 is coupled through a first matching network 114 to a plasma power source 112. The plasma power source 112 is typically capable of producing up to about 3000 Watts (W) at a tunable frequency in a range from about 50 kHz to about 13.56 MHz. In one embodiment, the plasma power source 112 provides about 100 to about 600 W of inductively coupled RF power at a frequency of about 13.56 MHz.

The substrate pedestal (cathode) 124 is coupled through a second matching network 142 to a biasing power source 140. The biasing source 140 provides between about zero to about 600 W at a tunable pulse frequency in the range of about 1 to about 10 kHz. The biasing source 140 produces pulsed RF power output. Alternatively, the biasing source 140 may produce pulsed DC power output. It is contemplated that the source 140 may also provide a constant DC and/or RF power output.

In one embodiment, the biasing source 140 is configured to provide RF power less than about 600 Watts at a frequency between about 1 to about 10 kHz, with a duty cycle between about 10 to about 95 percent. In another embodiment, the biasing source 140 is configured to provide RF power between about 20 to about 150 Watts, at a frequency between about 2 to about 5 kHz, with a duty cycle between about 80 to about 95 percent.

In one embodiment configured as a DPS® processing chamber, the substrate support pedestal 124 includes an electrostatic chuck 160. The electrostatic chuck 160 comprises at least one clamping electrode 132 and is controlled by a chuck power supply 166. In alternative embodiments, the substrate pedestal 124 may comprise substrate retention mechanisms such as a susceptor clamp ring, a vacuum chuck, a mechanical chuck, and the like.

A gas panel 120 is coupled to the process chamber 102 to provide process and/or other gases to the interior of the process chamber 102. In the embodiment depicted in FIG. 1, the gas panel 120 is coupled to one or more inlets 116 formed in a channel 118 in the sidewall 104 of the chamber 102. It is contemplated that the one or more inlets 116 may be provided in other locations, for example, in the ceiling 108 of the process chamber 102.

In one embodiment, the gas panel 120 is adapted to provide fluorinated process gas through the inlets 116 and into the interior of the process chamber 102. During processing, a plasma is formed from the process gas and maintained through inductive coupling of power from the plasma power source 112. The plasma may alternatively be formed remotely or ignited by other methods. In one embodiment, the process gas provided from the gas panel 120 includes at least one of a fluorinated gas, a chlorine containing gas, and a carbon containing gas.

The pressure in the chamber 102 is controlled using a throttle valve 162 and a vacuum pump 164. The vacuum pump 164 and throttle valve 162 are capable of maintaining chamber pressures in the range of about 1 to about 20 mTorr.

The temperature of the wall 104 may be controlled using liquid-containing conduits (not shown) that run through the wall 104. Wall temperature is generally maintained at about 65 degrees Celsius. Typically, the chamber wall 104 is formed from a metal (e.g., aluminum, stainless steel, and the like) and is coupled to an electrical ground 106. The process chamber 102 also comprises conventional systems for process control, internal diagnostic, end point detection, and the like. Such systems are collectively shown as support systems 154.

A reticle adapter 182 is used to secure a substrate (such as a reticle or other workpiece) 122 onto the substrate support pedestal 124. The reticle adapter 182 generally includes a lower portion 184 milled to cover an upper surface of the pedestal 124 (for example, the electrostatic chuck 160) and a top portion 186 having an opening 188 that is sized and shaped to hold the substrate 122. The opening 188 is generally substantially centered with respect to the pedestal 124. The adapter 182 is generally formed from a single piece of etch resistant, high temperature resistant material such as polyimide ceramic or quartz. A suitable reticle adapter is disclosed in U.S. Pat. No. 6,251,217, issued on Jun. 26, 2001, and incorporated herein by reference. An edge ring 126 may cover and/or secure the adapter 182 to the pedestal 124.

A lift mechanism 138 is used to lower or raise the adapter 182, and hence, the substrate 122, onto or off of the substrate support pedestal 124. Generally, the lift mechanism 138 comprises a plurality of lift pins (one lift pin 130 is shown) that travel through respective guide holes 136.

In operation, the temperature of the substrate 122 is controlled by stabilizing the temperature of the substrate pedestal 124. In one embodiment, the substrate support pedestal 124 comprises a heater 144 and an optional heat sink 128. The heater 144 may be one or more fluid conduits configured to flow a heat transfer fluid therethrough. In another embodiment, the heater 144 may include at least one heating element 134 that is regulated by a heater power supply 168. Optionally, a backside gas (e.g., helium (He)) from a gas source 156 is provided via a gas conduit 158 to channels that are formed in the pedestal surface under the substrate 122. The backside gas is used to facilitate heat transfer between the pedestal 124 and the substrate 122. During processing, the pedestal 124 may be heated by the embedded heater 144 to a steady-state temperature, which in combination with the helium backside gas, facilitates uniform heating of the substrate 122.

The controller 146 comprises a central processing unit (CPU) 150, a memory 148, and support circuits 152 for the CPU 150 and facilitates control of the components of the process chamber 102 and, as such, of the etch process, as discussed below in further detail. The controller 146 may be one of any form of general-purpose computer processor that can be used in an industrial setting for controlling various chambers and sub-processors. The memory 148 of the CPU 150 may be one or more of readily available memory such as random access memory (RAM), read only memory (ROM), floppy disk, hard disk, or any other form of digital storage, local or remote. The support circuits 152 are coupled to the CPU 150 for supporting the processor in a conventional manner. These circuits include cache, power supplies, clock circuits, input/output circuitry and subsystems, and the like. The inventive method is generally stored in the memory 148 or other computer-readable medium accessible to the CPU 150 as a software routine. Alternatively, such software routine may also be stored and/or executed by a second CPU (not shown) that is remotely located from the hardware being controlled by the CPU 150.

Figure 2:
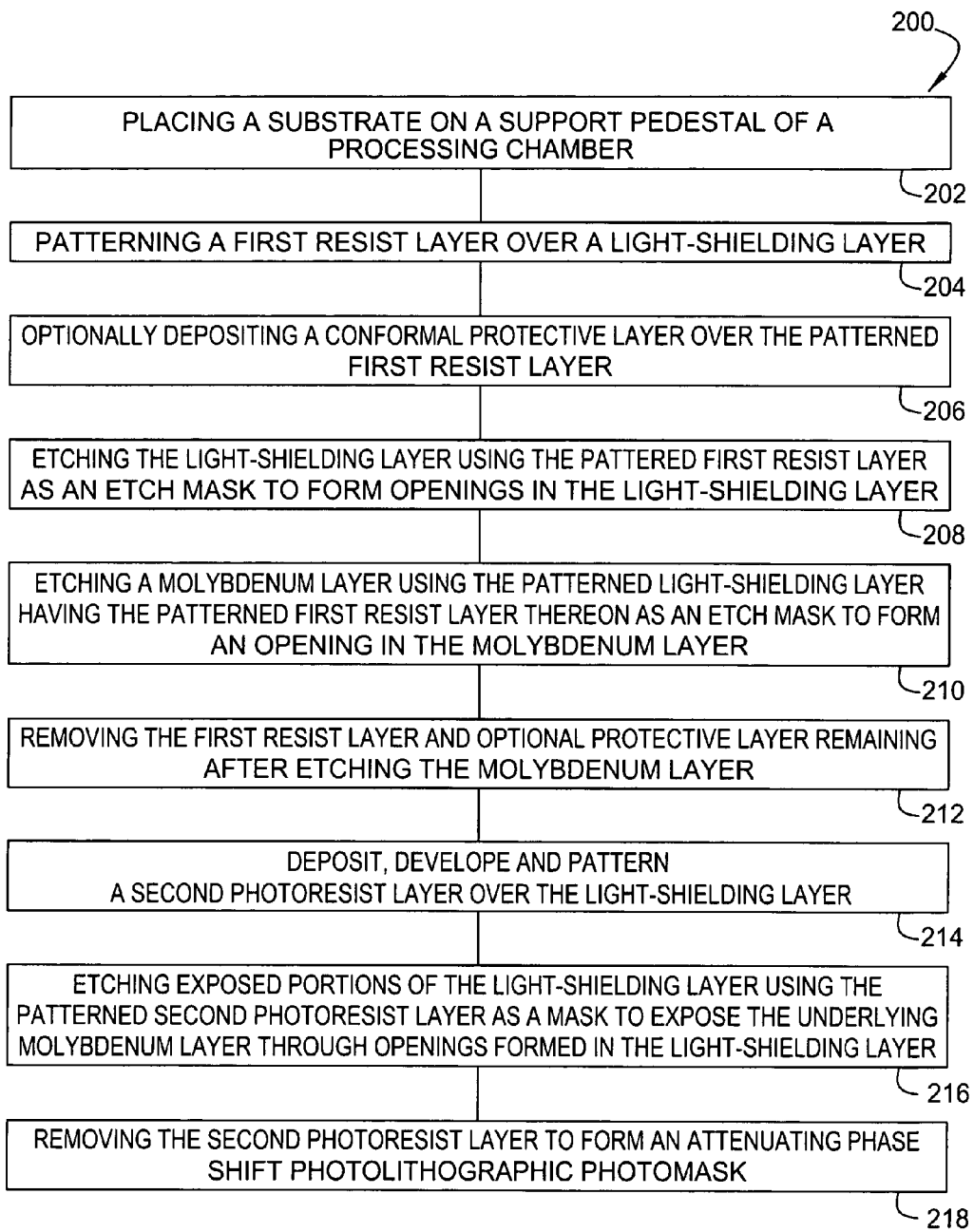
FIG. 2 is a flow diagram of one embodiment of a method for etching a molybdenum layer.

FIG. 2 is a flow diagram of one embodiment of a method 200 for etching a molybdenum layer. The molybdenum layer may be silicon nitride (SiN) doped with molybdenum (Mo), molybdenum silicide, molybdenum silicon (MoSi), molybdenum silicon oxynitride ($MoSi_xN_yO_z$), combinations thereof, or other suitable light-attenuating molybdenum containing material. Although the method 200 is described below with reference to processing one embodiment of a film stack $300_i$ utilized to fabricate a photomask 340 in FIGS. 3A-I, the beneficial attributes of method 200 may also be used to advantage in other molybdenum etching applications. The subscript "i" is a integer representing different fabrication stages the film stack shown in FIGS. 3A-I.

Figure 3A:
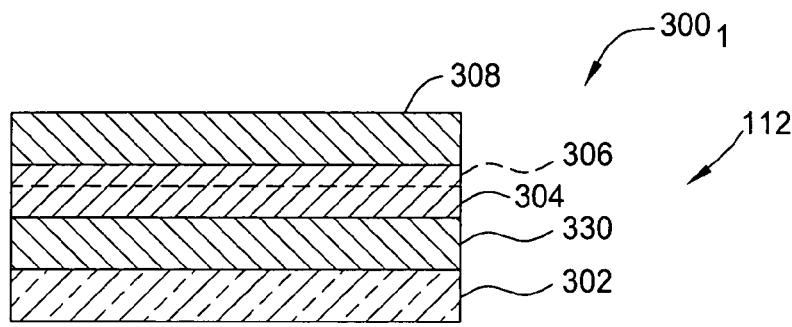
FIGS. 3A-I are one embodiment of quartz phase shift photomask fabricated utilizing one embodiment of the molybdenum layer etch method of the present invention.

The method 200, which may be stored in computer readable form in the memory 148 of the controller 146 or other storage medium, begins at step 202 when the substrate 122 is placed on a support pedestal 124. In one embodiment, the substrate 122 rests in the opening 188 of the adapter 182. The substrate 122 includes the film stack 300, as shown in FIG. 3A. The film stack $300_1$ includes an optically transparent silicon based material, such as quartz (i.e., silicon dioxide ($SiO_2$)) layer 302, an opaque light-shielding layer 304 and a molybdenum layer 330. The opaque light-shielding layer 304 is disposed on the as quartz layer 302. The light-shielding layer 304 is typically comprised of chromium and/or chromium oxide. In one embodiment, the light-shielding layer 304 includes a chromium layer coated with a thin layer of chromium oxide, having a total thickness of about 500 Angstroms. The film stack $300_1$ may include an optional antireflection layer 306 (shown in phantom) formed on the light-shielding layer 304. The film stack $300_1$ also includes a first resist layer 308 disposed on the light-shielding layer 304 or antireflection layer 306, when present. An example of a suitable material for the resist layer 308 is "RISTON," manufactured by duPont de Nemours Chemical Company, and may be disposed on the light-shielding layer 304 to a thickness between about 200 and 600 nm thick. The molybdenum layer 330 is interposed between the quartz layer 302 and light-shielding layer 304 and serves as a light-attenuating layer for phase shifting of light during use of the photomask.

The molybdenum layer 330 generally has a thickness about equal to the length of 180 degrees phase shift through the molybdenum layer 330 for a wavelength of light intended for use with the phase shift mask. Typical wavelengths are 193 and 248 nm. Thus, the molybdenum layer 330 is typically about 50 to about 100 nm thick, although other thicknesses may be utilized for masks intended for use with different lithographic light wavelengths.

Figure 3B:
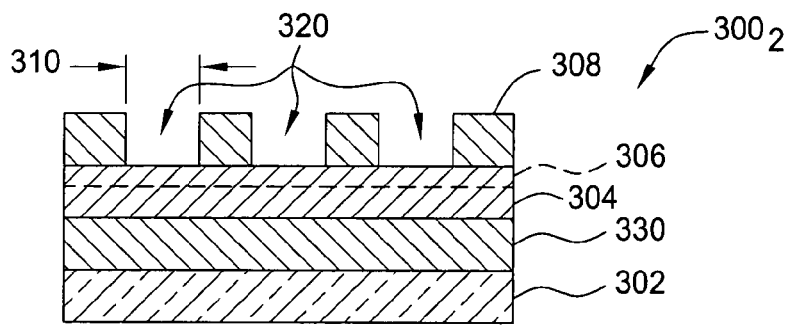

At step 204, the first resist layer 308 is patterned over the light-shielding layer 304 as illustrated in the film stack $300_2$ depicted in FIG. 3B to form openings 320 through the resist 308 to expose portions of the light-shielding layer 304. The openings 320 generally define a critical dimension (CD) as a width 310. The width 310 is selected to have a predefined CD to be transferred to the finished openings defining the light paths through the finished photomask as further described below. The first resist layer 308 may be patterned by any suitable method.

Figure 3C:
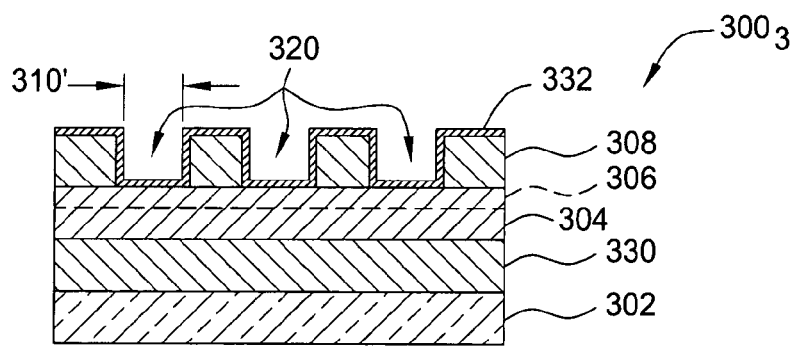

At an optional step 206, a conformal protective layer 332 is deposited over the patterned first resist layer 308 as illustrated in the film stack $300_3$ depicted in FIG. 3C. The protective layer 332 may be a polymer and may be deposited in-situ (i.e., the same) the processing system and/or chamber in which any one of the subsequently described etching processes are preformed. The protective layer 332 may be deposited to a thickness of between about 100 to about 500 Angstroms, and in another embodiment, is between about 150 to about 200 Angstroms. In such an embodiment, the width 310 of the opening 320 is selected such that the thickness of the material conformally deposited on the sidewalls of the opening 320 reduces the width 310 to a target critical dimension (CD) 310'. In embodiments where the protective layer 332 is not used, the width 310 is the target CD.

In one embodiment, the protective layer 332 is deposited by using a fluorocarbon processing gas, for example, CHF.sub.3 and/or C.sub.4F.sub.8, among others. Optionally, the processing gas may include Ar for dilution and improved deposition uniformity. In one embodiment, the protective layer 332 may be deposited using a plasma power of between about 200 and about 500 W, a bias power between about 0 to about 20 W. One exemplary process gas utilized to form the protective layer 332 includes forming a plasma using about 100 sccm CHF.sub.3 and about 100 sccm Ar. The protective layer 332 formed is generally a carbon polymer with hydrogen, and is deposited up to about 500 Angstroms thick. One example of a method for depositing a protective layer on a patterned resist layer for subsequent etching of an underlying layer is described in U.S. patent application Ser. No. 11/044,339, entitled METHOD FOR PHOTOMASK PLASMA ETCHING USING A PROTECTED MASK, filed by M. CHANDRACHOOD et al. on Jan. 27, 2005, which is incorporated by reference in its entirety.

Figure 3D:
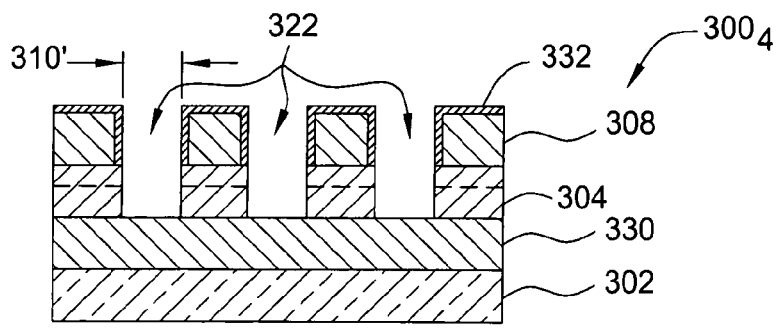

At step 208, the light-shielding layer 304 is etched using the patterned first resist layer 308 as an etch mask to form openings 322 in the light-shielding layer 304 as illustrated in the film stack 300₄ depicted in FIG. 3D. In embodiments where the protective layer 332 is utilized, the chromium etching step 208 includes removing the horizontal portions of the optional protective layer disposed in the openings 320 of the patterned resist to exposed portions of the light-shielding layer 304. As the vertical portions of the protective layer 332 disposed on the sidewalls of the patterned resist are removed very slowly as compared to the horizontal portions of the protective layer, light-shielding layer 304 is etch while the protective layer 332 disposed on the sidewalls of the patterned resist substantially retains its critical dimension (CD) of the opening, thereby allowing accurate transfer of the mask CD to the opening formed in the chromium layer during the etch step 208. In other words, the width 310' of the opening 320 of the patterned first resist layer 308 is accurately transferred to the opening 322 of the light-shielding layer 304. The step of etching the light-shielding layer 304 may be performed in the processing chamber 100 in which the molybdenum layer 330 is etch, as described below, or in another processing chamber coupled to the processing system 180.

In one embodiment, the etch step 208 forming a plasma from one or more fluorinated process gases are introduced into the process chamber 102 through the gas inlet 116. Exemplary process gases may include $CF_4$ and $CHF_3$, among others. The processing gas may further include an inert gas, such as He, Ar, Xe, Ne, and Kr.

In another embodiment, the exposed light-shielding layer 304 of the substrate 122 is etched using the Tetra I, Tetra II, or DPS® II etch module by providing $CF_4$ at a rate of 2 to 50 standard cubic centimeters per minute (sccm) and $CFH_3$ at a rate of 10 to 50 sccm. One specific process recipe provides $CF_4$ at a rate of 9 sccm, $CHF_3$ at a rate of 26 sccm. The pressure in the process chamber is controlled to less than about 40 mTorr, and in one embodiment, between about 1 and about 10 mTorr, for example 2 mTorr.

During the chromium etch step 208, a substrate bias power less than about 600 W, and in a first example, less than about 100 W, and in a second example, between 30 and about 80 W, is applied to the support pedestal 124 to bias the substrate 122. One specific process recipe applies about 65 W of bias power at a tunable pulse frequency in the range of about 1 to about 10 kHz.

During step 208, plasma, formed from the process gases, is maintained by applying RF power of between about 300 to about 600 W from the plasma power source 112 to the antenna 110. It is contemplated that the plasma may be ignited by any number of methods. In one embodiment, RF power of about 250 W is applied to the antenna 110 at a frequency of about 13.56 MHz.

The light-shielding layer 304 exposed on the substrate 122 is etched until an endpoint is reached. The endpoint may be determined by time, optical interferometry, chamber gas emission spectrography or by other suitable methods. The etching step may be performed in-situ the tool or processing chamber in which the deposition step 206 was performed.

Another exemplary etch process is described in U.S. patent application Ser. No. 10/235,223, filed Sep. 4, 2002, which is incorporated herein by reference in its entirety. It is contemplated that other suitable chromium etch processes may be utilized.

Figure 3E:
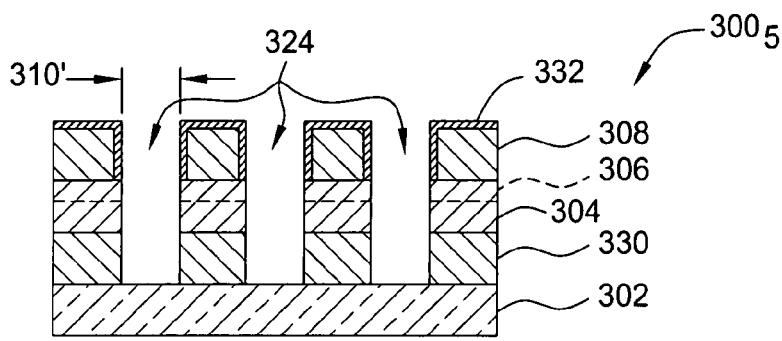

At step 210, the molybdenum layer 330 is etched using the patterned light-shielding layer 304 having the patterned first resist layer 308 thereon as an etch mask as illustrated in the film stack 300₅ depicted in FIG. 3E. The first resist layer 308 (and the optional layer 332, when present) protects the upper edges of the openings 322 formed in the light-shielding layer 304 during the molybdenum etch process, thereby facilitating a more accurate transfer of critical dimensions (e.g., the width 310' of the opening 322) to an opening 324 formed in the molybdenum layer 330. Moreover, the patterned first resist layer 308 protects the chromium oxide coating which is very thin. If the chromium oxide layer is removed during etching, the high reflectance of the remaining chromium of the light-shielding layer with adversely effect a subsequent lithograph process, as further described below.

The molybdenum layer 330 may be plasma etched by a processing gas including (i) one or more fluorine containing polymerizing materials, (ii) a chlorine containing gas, and optionally, (iii) an inert gas, to form the openings 324 in the molybdenum layer 330, exposing the underlying quartz layer 302. A polymerization limiting or inhibiting gas may also be included in the processing gas.

The one or more fluorine containing gas may include one or more fluorine containing hydrocarbons, hydrogen free fluorine containing gases, or combinations thereof. The one or more fluorine containing hydrocarbons may have the general formula $C_xH_yF_z$, wherein x is an integer from 1 to 5 of carbon atoms, y is an integer from 1 to 8 of hydrogen atoms, and z is an integer from 1 to 8 of fluorine atoms. Examples of fluorine containing hydrocarbon gases include $CHF_3$, $CH_3F$, $CH_2F_2$, $C_2HF_5$, $C_2H_4F_2$, and combinations thereof. Fluorine containing hydrocarbon gases having from 1 to 2 atoms of carbon, from 1 to 4 atoms of hydrogen, and from 1 to 5 atoms of fluorine, such as $CHF_3$, may be used when etching the molybdenum layer 330.

The hydrogen free fluorocarbon gases may have from 1 to 5 atoms of carbon and from 4 to 8 atoms of fluorine. Examples of hydrogen free fluorocarbon gases include $CF_4$, $C_2F_6$, $C_4F_6$, $C_3F_8$, $C_4F_8$, $C_5F_8$, and combinations thereof. Optionally, the processing gas may include additional etching gases for example, sulfur fluorides, such as sulfur hexafluoride ($SF_6$).

Fluorine containing gases may be advantageously used to form passivating polymer deposits on the surfaces, particularly the sidewalls, of openings formed in a patterned resist material and etched optically transparent materials. The passivating polymer deposits prevent excessive etching of the feature definitions, improving the transfer of the planned critical dimensions to the molybdenum layer 330. A plasma formed from one or more fluorine containing hydrocarbon gases produces fluorine-containing species that etch the molybdenum layer 330 on the substrate 122 without the presence of an oxidizing gas.

The chlorine-containing gases are selected from the group of chlorine ($Cl_2$), carbon tetrachloride ($CCl_4$), hydrochloric acid (HCl), and combinations thereof, and are used to supply highly reactive radicals to etch the optically transparent material. The chlorine-containing gas provides a source of etching radicals and hydrogen or carbon-containing chlorine-containing gases may provide a source of material for forming passivating polymer deposits, which may improve etch bias.

The processing gas may also include an inert gas which, when ionized as part of the plasma comprising the processing gas, results in sputtering species to increase the etching rate of the feature definitions. The presence of an inert gas as part of the plasma may also enhance dissociation of the processing gas. Additionally, inert gases added to the process gas form ionized sputtering species and may further sputter-off any formed polymer deposits on the sidewalls of the freshly etched feature definitions, thereby reducing any passivating deposits and providing a controllable etch rate. It has been observed that the inclusion of an inert gas into the processing gas provides improved plasma stability and improved etching uniformity. Examples of inert gases include argon (Ar), helium (He), neon (Ne), xenon (Xe), krypton (Kr), and combinations thereof, of which argon and helium are generally used.

In one example, the processing gas for etching the molybdenum layer 330 may include chlorine ($Cl_2$) gas, trifluoromethane ($CHF_3$), and argon as an inert gas. Optionally, the processing gas may include one or more polymerization limiting gases, such as oxygen, ozone, nitrogen, or combinations thereof, may be used to control the etching rates of the processing gas by controlling the formation and removal of passivating polymer deposits on the substrate. Oxygen containing gases enhance the formation of free oxygen species that react with other species to reduce the formation of polymers that deposit on the surfaces of the etched feature definitions as passivating deposits. For example, oxygen gases react with some of the radicals of the plasma process, such as $CF_2$, to form volatile radicals, such as $COF_2$, which are exhausted from the processing chamber.

The total flow rate of the processing gases, including the inert gas and optional gases, are introduced at a flow rate of greater than about 15 sccm, such as between about 15 sccm and about 200 sccm for etching a 150 mm by 150 mm square photolithographic reticle substrate in an etch chamber. The chlorine-containing gas is introduced into the processing chamber at a flow rate of between about 5 sccm and about 100 sccm for etching a 150 mm by 150 mm square photolithographic reticle substrate. When the fluorine containing gas is introduced into the processing chamber, a flow rate between about 1 sccm and about 50 sccm is used for etching a 150 mm by 150 mm square photolithographic reticle substrate. When the inert gas is introduced into the processing chamber, a flow rate between about 0 sccm and about 100 sccm is used for etching a 150 mm by 150 mm square photolithographic reticle substrate. Optionally, when polymerization limiting gases are introduced into the processing chamber, a flow rate between about 1 sccm and about 100 sccm is used for etching a 150 mm by 150 mm square photolithographic reticle substrate. The individual and total gas flows of the processing gases may vary based upon a number of processing factors, such as the size of the processing chamber, the size of the substrate being processed, and the specific etching profile desired by the operator.

Generally, the processing chamber pressure is maintained between about 2 milliTorr and about 50 milliTorr. A chamber pressure between about 3 milliTorr and about 20 milliTorr, for example, 3 milliTorr and 10 milliTorr, may be maintained during the etching process.

Figure 3F:
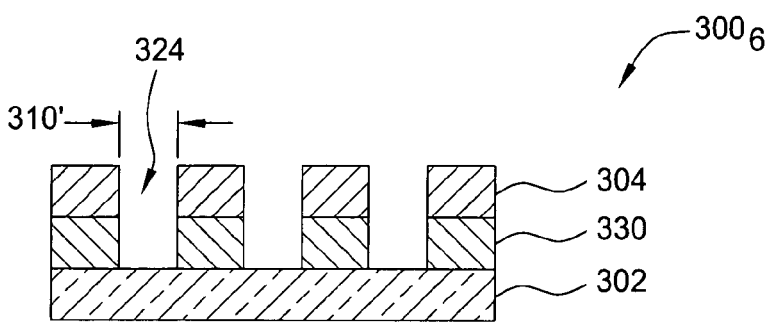

At step 212, the first resist layer 308 and optional protective layer 332 remaining after the etch step 210 are removed, as illustrated in the film stack $300_6$ depicted in FIG. 3F. In one embodiment, the remaining resist and protective layers are removed by ashing. For example, ashing may occur in the processing chamber 192 of FIG. 1A (in-situ the processing system 180) or in-situ the processing chamber 100 in which the etching step 210 was performed.

Figure 3G:
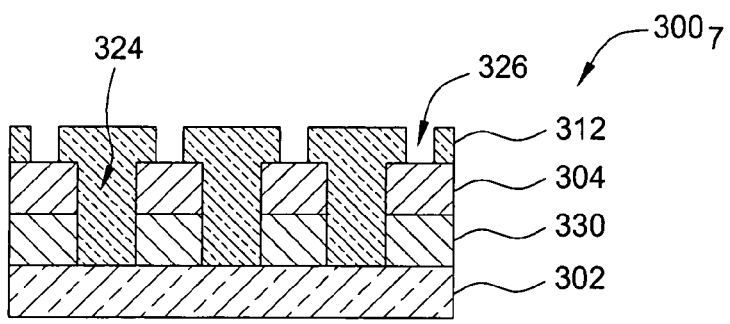

At step 214, a second photoresist layer 312 is deposited, developed, and patterned to form openings 326 to expose the underlying light-shielding layer 304, as illustrated in the film stack $300_7$ depicted in FIG. 3G. Step 214 may be performed as described above with reference to step 204. In one embodiment, the second photoresist layer 312 is deposited to a depth of about 200 nm thick, but may be of any thickness, and in another embodiment, the second photoresist layer 312 is of at least the same thickness as the light-shielding layer 304.

Figure 3H:
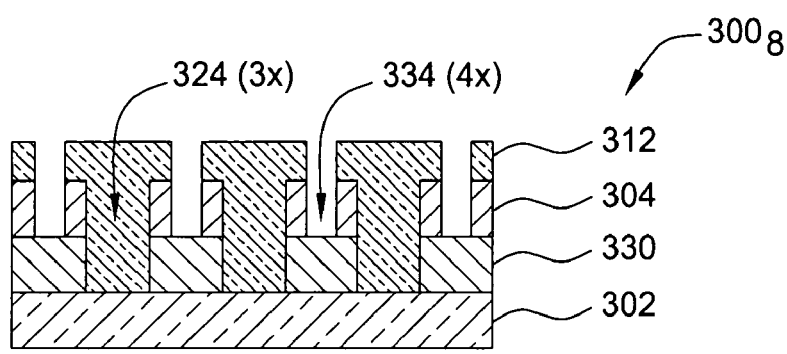

At step 216, the patterned second photoresist layer 312 is utilized as a mask to etched the exposed portions of the light-shielding layer 304 to expose the underlying molybdenum layer 330 through openings 334 formed in the light-shielding layer 304, as illustrated in the film stack $300_8$ depicted in FIG. 3H. Step 216 may be performed as above with reference to step 208 and optional step 206. The opening 334 defines a phase shift feature which modifies the phase of light passing therethough (as compared to light passing through the opening 324) to reduce diffraction and improve resolution in forming feature definitions with photolithographic processes.

Figure 3I:
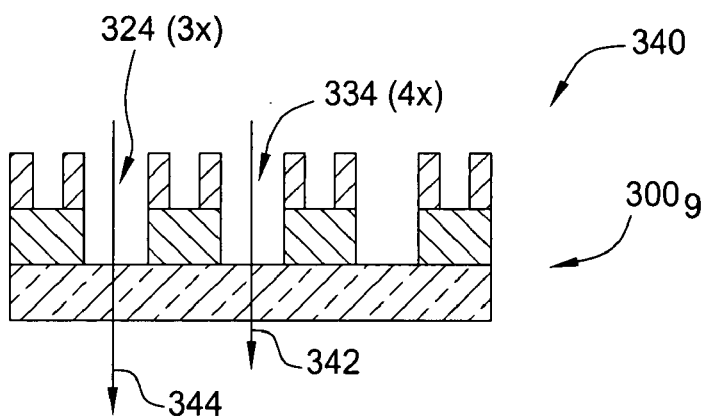

At step 218, the second photoresist layer 312 is removed as illustrated in the film stack $300_9$ depicted in FIG. 3I to form an attenuating phase shift photolithographic photomask 340. The second photoresist layer 312 may be removed as described with reference to step 212 above. In use, light 342 passing through a region of the photomask 340 defined by the opening 334 will have a wavelength 180 degrees out of phase relative to light 344 passing through a region of the photomask 340 defined by the opening 324.

Advantages of the etch method 200 over conventional etch methods includes more accurate transfer of feature widths between masking layers during photomask fabrication, thereby allowing good control of CDs of the finished photomask. Particularly, the use of a composite mask to etch the light-attenuating layer advantageously minimizes etch bias, resulting in accurate transfer of critical dimensions to the lower layers of the photomask during fabrication. Accordingly, use of the method 200 is highly desirable for etch applications where control and reproducibility of small critical dimensions is required.

While the foregoing is directed to embodiments of the present invention, other and further embodiments of the invention may be devised without departing from the basic scope thereof, and the scope thereof is determined by the claims that follow.

What is claimed is:

1. A method of forming a photomask, comprising:
providing a film stack in a processing chamber, the film stack having an optically transparent silicon based material having a molybdenum layer disposed thereon, a patterned light-shielding layer disposed on the molybdenum layer and a composite mask having at least a patterned first photoresist layer, wherein the patterned light shielding layer comprises a plurality of structures between a plurality of first openings in the light shielding layer exposing the molybdenum layer;
plasma etching the molybdenum layer to form a molybdenum layer opening exposing the optically transparent silicon based material using the composite mask, wherein the plasma etching the molybdenum layer further comprises depositing a conformal polymer layer on the patterned first resist layer prior to forming the patterned light shielding layer;
depositing a second photoresist layer on the light-shielding layer;
patterning the second photoresist layer on a the light-shielding layer, wherein the second photoresist layer fills the molybdenum layer opening after patterning and wherein the second photoresist layer defines a plurality of second openings at a center portion of each of the plurality of structures; and
plasma etching the light-shielding layer using the second photoresist layer as an etch mask to form the plurality of second openings exposing the molybdenum layer.

* * * * *